US011157352B2

(12) United States Patent
Kern et al.

(10) Patent No.: US 11,157,352 B2
(45) Date of Patent: Oct. 26, 2021

(54) COMPENSATION OF READ ERRORS

(71) Applicant: Infineon Technologies AG, Neubiberg (DE)

(72) Inventors: Thomas Kern, Aschheim (DE); Michael Goessel, Mahlow (DE)

(73) Assignee: Infineon Technologies AG, Neubiberg (DE)

(*) Notice: Subject to any disclaimer, the term of this patent is extended or adjusted under 35 U.S.C. 154(b) by 124 days.

(21) Appl. No.: 16/575,598

(22) Filed: Sep. 19, 2019

(65) Prior Publication Data

US 2020/0104206 A1   Apr. 2, 2020

(30) Foreign Application Priority Data

Oct. 2, 2018 (DE) .................. 102018124296.4

(51) Int. Cl.
| | |
|---|---|
| G06F 11/10 | (2006.01) |
| G11C 7/10 | (2006.01) |
| G11C 29/52 | (2006.01) |
| G11C 13/00 | (2006.01) |
| G11C 11/16 | (2006.01) |
| G06F 3/06 | (2006.01) |
| G06F 11/07 | (2006.01) |

(52) U.S. Cl.
CPC ........ G06F 11/1004 (2013.01); G11C 7/1051 (2013.01); *G06F 3/0679* (2013.01); *G06F 11/0751* (2013.01); *G11C 11/1673* (2013.01); *G11C 11/1693* (2013.01); *G11C 13/0061* (2013.01); *G11C 29/52* (2013.01); *G11C 2013/0045* (2013.01)

(58) Field of Classification Search
CPC ............... G11C 29/52; G11C 11/1673; G11C 2013/0045; G11C 11/1693; G11C 13/0061; G11C 7/1051; G06F 11/1051; G06F 3/0679; G06F 11/1004
See application file for complete search history.

(56) References Cited

U.S. PATENT DOCUMENTS

| | | | |
|---|---|---|---|
| 9,805,771 B2 | 10/2017 | Loibl | |
| 2010/0281340 A1 | 11/2010 | Franceschini | |
| 2015/0243333 A1* | 8/2015 | Loibl | ............ G11C 29/50 365/189.011 |
| 2017/0199786 A1* | 7/2017 | Muralimanohar | .... H03M 13/13 |

* cited by examiner

Primary Examiner — April Y Blair
Assistant Examiner — Sazzad Hossain
(74) Attorney, Agent, or Firm — Eschweiler & Potashnik, LLC

(57) ABSTRACT

A method for compensating for a read error is disclosed, wherein each of n states are read from memory cells of a memory, the states being determined in a time domain. If the n states do not form a code word of a k-from-n code, a plurality of states from the n states, which were determined within a reading window, are provided with a first valid assignment and fed to an error processing stage. If the error processing does not indicate an error, the n states are further processed with the first valid assignment, and if the error processing indicates an error, the plurality of states that were determined within the reading window are provided with a second valid assignment and the n states are further processed with the second valid assignment. Accordingly, a device, a system and a computer program product are also disclosed.

20 Claims, 11 Drawing Sheets

Fig.2

| Cell₅ | LRS | LRS | LRS | LRS | LRS | LRS | | HRS | HRS |
| --- | --- | --- | --- | --- | --- | --- | --- | --- | --- |
| Cell₄ | LRS | LRS | LRS | LRS | HRS | HRS | | HRS | HRS |
| Cell₃ | LRS | HRS | HRS | LRS | LRS | LRS | ⋮ | LRS | HRS |
| Cell₂ | HRS | LRS | HRS | HRS | LRS | HRS | | HRS | LRS |
| Cell₁ | HRS | HRS | LRS | HRS | HRS | LRS | | LRS | LRS |
| Cell₀ | HRS | HRS | HRS | LRS | HRS | HRS | | LRS | LRS |

| Row number | S0 | S1 | S2 | S3 | S4 | S5 |
|---|---|---|---|---|---|---|
| 1 | 0 | 0 | 0 | 1 | 1 | 1 |
| 2 | 0 | 0 | 1 | 0 | 1 | 1 |
| 3 | 0 | 0 | 1 | 1 | 0 | 1 |
| 4 | 0 | 0 | 1 | 0 | 1 | 0 |
| 5 | 0 | 1 | 0 | 1 | 1 | 1 |
| 6 | 0 | 1 | 0 | 1 | 0 | 1 |
| 7 | 0 | 1 | 0 | 0 | 0 | 0 |
| 8 | 0 | 1 | 1 | 0 | 1 | 1 |
| 9 | 0 | 1 | 1 | 0 | 0 | 0 |
| 10 | 0 | 1 | 1 | 1 | 1 | 0 |
| 11 | 1 | 0 | 0 | 0 | 0 | 1 |
| 12 | 1 | 0 | 0 | 1 | 1 | 1 |
| 13 | 1 | 0 | 1 | 0 | 0 | 0 |
| 14 | 1 | 0 | 1 | 1 | 1 | 1 |
| 15 | 1 | 0 | 1 | 0 | 0 | 0 |
| 16 | 1 | 1 | 0 | 0 | 0 | 1 |
| 17 | 1 | 1 | 0 | 0 | 1 | 0 |
| 18 | 1 | 1 | 0 | 0 | 0 | 0 |
| 19 | 1 | 1 | 0 | 0 | 0 | 0 |
| 20 | 1 | 1 | 1 | 0 | 0 | 0 |

Fig.7

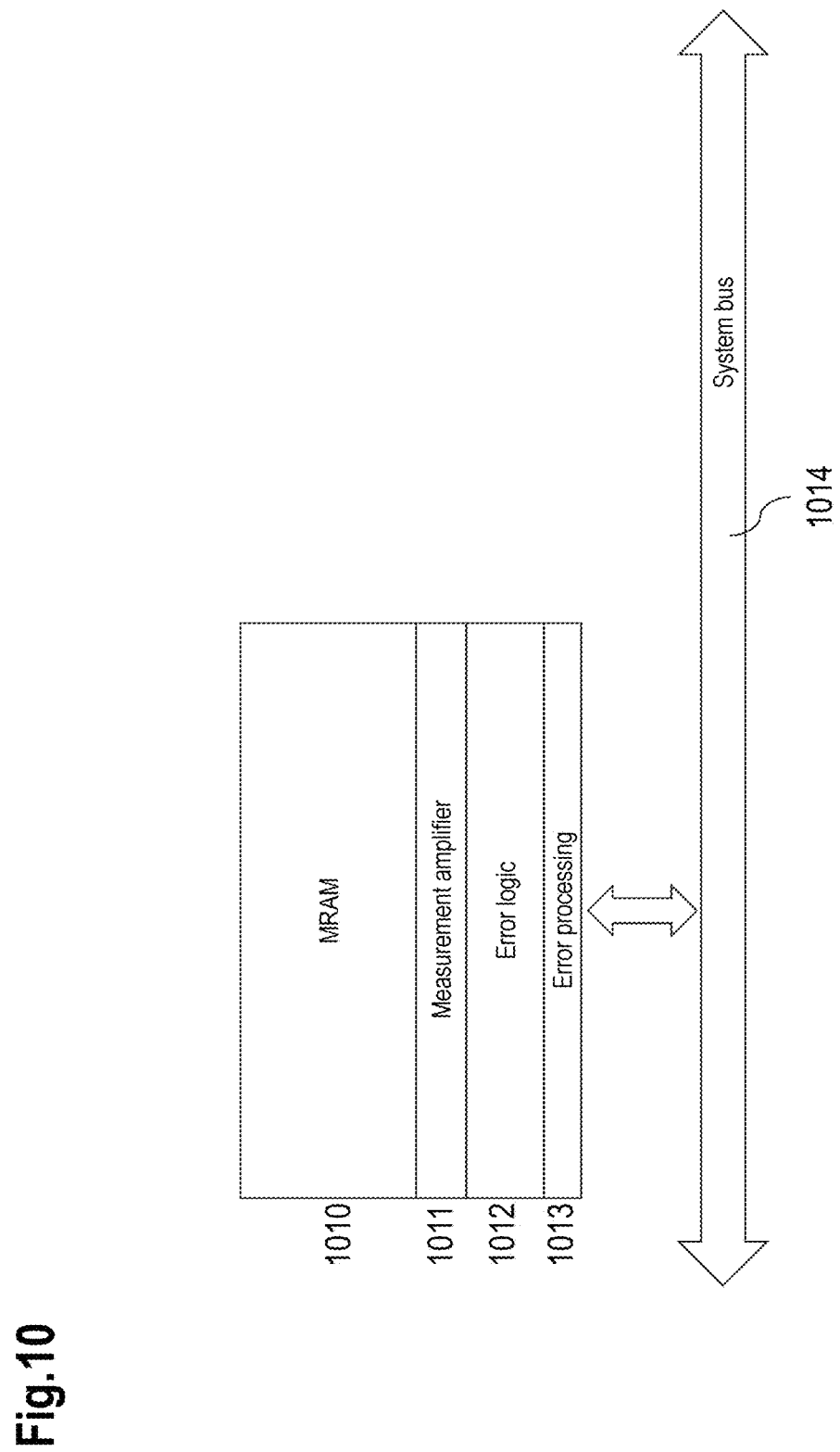

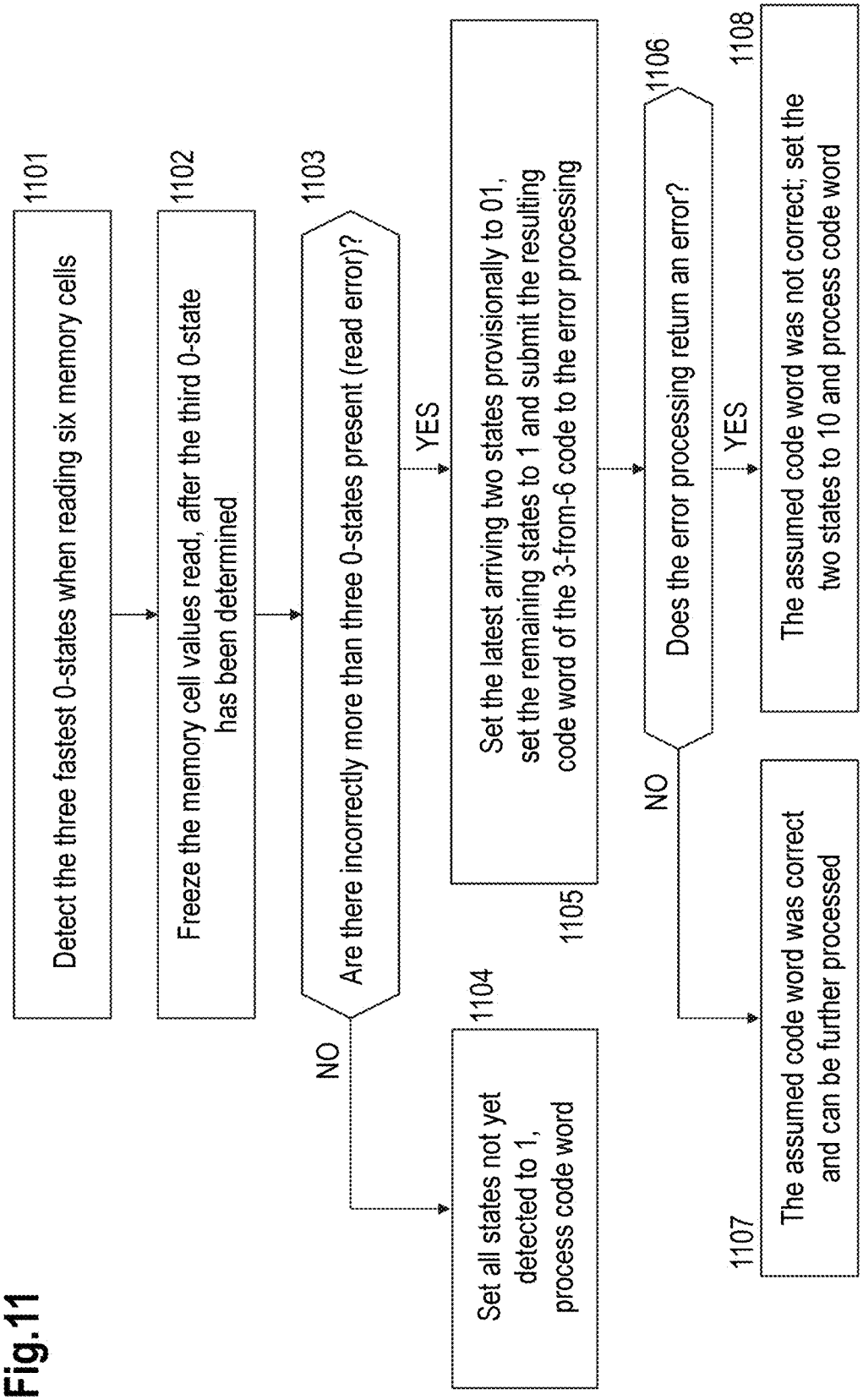

COMPENSATION OF READ ERRORS

REFERENCE TO RELATED APPLICATION

This Application claims priority to German Application No. 10 2018 124 296.4, filed on Oct. 2, 2018, the contents of which are hereby incorporated by reference in their entirety.

FIELD

The disclosure relates to the compensation of read errors.

BACKGROUND

From U.S. Pat. No. 9,805,771 B2 it is known to evaluate states that are read from memory cells, to transform them into the time domain and accordingly to use earlier incoming states for the efficient readout of memory cells.

SUMMARY

The present disclosure is directed to a system and method for compensating read errors that can occur when multiple states coincide within a temporal reading window.

A method for compensating for a read error is disclosed and comprises reading each of n states from memory cells of a memory, wherein the states are determined in a time domain.

If the n states do not form a code word of a k-from-n code, providing a plurality of states from the n states, which were determined within a reading window, with a first valid assignment and feeding the provided plurality of states to an error processing stage.

If the error processing does not indicate an error, further processing the n states with the first valid assignment, and if the error processing indicates an error, providing the plurality of states that were determined within the reading window with a second valid assignment and further processing the n states with the second valid assignment.

The first valid condition is thus tried provisionally and either rejected or detected as free of errors by the error processing. In the first case (rejection by the error processing), the second valid condition (for 2 incorrect positions there are exactly 2 possible valid bit combinations) is used and taken as a basis for the further processing. In the second case (no rejection by the error processing) the result of the trial was correct and the first valid condition is used and taken as a basis for the further processing.

If more than two states occur in the reading window, the above approach can be extended in such a way that a plurality of valid conditions (third, fourth, etc.) are tried; if a valid condition is detected by the error processing as error-free, this valid condition continues to be used. Otherwise, the next possible valid condition is tried.

The valid conditions all have in common that they are code words of the k-from-n code.

It is described in detail here how the states are determined in the time domain. For further information, reference may also be made in this respect to U.S. Pat. No. 9,805,771 B2. As a result of the transformation of the variables to be detected into the time domain, the individual states occur sequentially in time. For example, 0-states occur before the 1-states (the names 0- and 1-state are chosen merely as examples for illustration). Therefore, after the arrival of the k 0-states the determination of the n-states can be terminated and the n-k remaining states can be assigned the value 1 (it is not necessary to wait until the 1-states have been determined, because as a result of the k-from-n code there are k 0-states and n-k 1-states).

If a read error occurs, because instead of the k-th 0-state two (or even more) 0-states are detected, there are more than k 0-states present, which is a violation of the code and thus represents a read error.

This read error can be corrected by the mechanism explained above of performing tests involving the error circuit.

In one embodiment, the valid assignment is a code word.

The code word can be, for example, a code word of the k-from-n code.

In one embodiment, the code word is further processed if the n states are a code word from the k-from-n code.

In another embodiment the memory cells are read in groups of n memory cells.

In an embodiment, the memory cells are complementary memory cells of a complementary memory.

The complementary memory may, in particular, be a differential read-only memory.

In an embodiment, the states are determined in the time domain by determining a number of k fastest states.

In another embodiment the fastest states are 0-states.

In another embodiment, the n states are not a code word of the k-from-n code, if at least one other fastest state is determined during the reading window for the k-th fastest state.

It is an embodiment that for k=3 the k fastest and the k−1 fastest states are determined, for k=4 the k fastest, the k−1 fastest and the k−2 fastest states are determined, or for k=5 the k fastest, the k−1 fastest, the k−2 fastest and the k−3 fastest states are determined.

This pattern can be continued accordingly for k>5. Thus, for example, for k=8 the 8, 7, 6, 5, 4, 3, 2 fastest states are determined. From this it is possible to derive what the first two states were, which state was the third fastest, etc.

In a further embodiment, the k fastest and the k−1 fastest states are determined.

Alternatively, it may be sufficient to know only the k fastest and the k−1 fastest, so that it can be clearly determined which plurality of states arrived together lastly in a reading window.

In another embodiment, the remaining states which do not belong to the k fastest states are set accordingly.

If the fastest states are 0-states, then after the determination of the k-th 0-state those states for which no assignment was made can be set to 1-states.

In another embodiment, the error processing comprises an error detection and/or error correction.

In another embodiment, the method is executed by a processing unit or circuit, which is functionally arranged between the memory and the error processing stage or circuitry, which is coupled to a system bus.

The processing unit can comprise software, hardware or mixed forms (firmware).

In another embodiment, the memory comprises at least one of the following memory units:
floating-gate-cells;
PCRAM,
RRAM,
MRAM,
MONOS components,
nanocrystal cells, and
ROM.

A device for compensating for a read error is also disclosed, and comprises a processing circuit which is configured to carry out a method as discussed above.

The device can be embodied in one component or circuit or distributed over a plurality of components or circuits. Also, the processing circuit can either comprise the error processing circuitry or be embodied separately from it. The memory can be part of the device or be embodied separately from it.

The processing unit or circuit mentioned here may be embodied, in particular, as a processor unit and/or an at least partially hard-wired or logical circuit arrangement, which is configured, for example, in such a way that the method can be carried out as described herein. Said processing unit can be or comprise any type of processor or computer with the necessary peripheral devices (memory, input/output interfaces, input and output devices, etc.).

The above remarks relating to the method apply to the device as appropriate.

Also, the above-mentioned objective is achieved by means of a system comprising at least one of the devices described here.

In addition, a system comprising at least one of the devices described here is disclosed.

A device for compensating for a read error is also disclosed, comprising a means for reading each of n states from memory cells of a memory, the states being determined in a time domain, and if the n states do not form a code word of a k-from-n code, means for providing a plurality of states from the n states, which were determined within a reading window, with a first valid assignment and feeding them to an error processing stage.

If the error processing does not indicate an error, a means for further processing the n states with the first valid assignment is provided, and if the error processing indicates an error, a means for providing the plurality of states that were determined within the reading window with a second valid assignment and for further processing the n states with the second valid assignment is provided.

The solution presented here also comprises a computer program product on a non-transitory storage medium that can be loaded directly into a memory of a digital computer, comprising program code parts which are suitable for carrying out acts of the method described here.

In addition, the above objective is achieved using a non-transitory computer-readable storage medium, e.g. any desired memory, comprising instructions executable by a computer (e.g. in the form of program code), which are suitable for enabling the computer to carry out the acts of the method described here.

BRIEF DESCRIPTION OF THE DRAWINGS

The properties, features and advantages described above and the manner in which these are achieved are also described in conjunction with the following schematic description of exemplary embodiments, which are explained in more detail in conjunction with the drawings. For clarity of exposition, identical or equivalent functional elements are labeled with the same reference numeral.

Shown are:

FIG. 2 is a table illustrating how on the basis of 6 memory cells $Cell_0$ to $Cell_5$, 20 different states are represented;

FIG. 7 is a truth table with the 20 possible code words of the 3-from-6 code;

FIG. 10 is an example system implementation for an MRAM;

FIG. 11 is a schematic flow diagram which shows an example of acts for carrying out a compensation of a read error described here.

DETAILED DESCRIPTION

The use of new memory technologies such as MRAM, RRAM or PCRAM offers cost advantages and improves compatibility with respect to the CMOS manufacturing process. In this disclosure the term "exemplary" is intended to mean an example rather than to infer an intended structure or method.

However, it is a challenge to cope with small reading windows between the individual states, for example between 0-states and 1-states.

Figure 1:
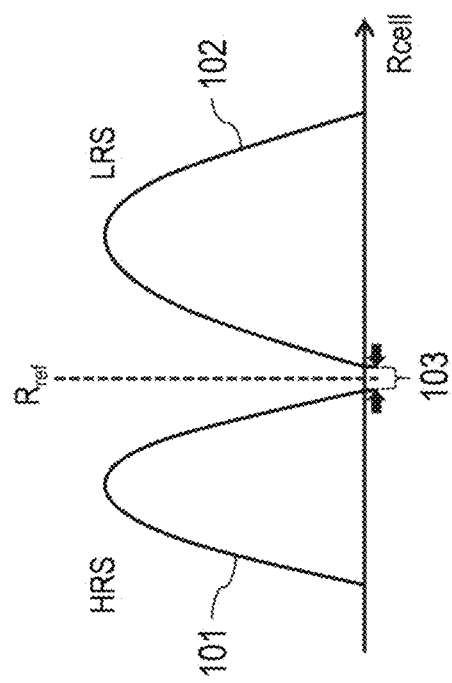
FIG. 1 is an exemplary diagram comprising two (frequency) distributions for cell resistances of memory cells.

FIG. 1 shows an exemplary diagram comprising two (frequency) distributions 101 and 102 for cell resistances of memory cells, between which a reading window 103 is situated. The distribution 101 shows, for example, a high-impedance state (HRS, "High Resistive State") and the distribution 102 shows an example of a corresponding low-impedance state (LRS, "Low Resistive State"). The reading window 103 is positioned around a reference value $R_{ref}$.

A placement of the reference value $R_{ref}$ to separate the two distributions 101 and 102 is problematic with regard to a high level of reliability and robustness in the differentiation of the states of the distributions 101 and 102. In addition, the unambiguous distinction between HRS and LRS is complicated by the fact that the characteristics of the memory change due to aging and/or temperature influences: for example, the size and/or position of the reading window 103 can be changed as a result. It is also possible that they cause the distributions 101 and 102 to approach each other or even overlap.

Complementary memory cells can be used to alleviate this problem. For example, two or more complementary memory cells can be used. In complementary memory cells a data bit is represented by (at least) two physical memory cells, which in the absence of errors have complementary states. If, for example, two complementary memory cells A1 and A2 are used to represent a logical data bit, the following can apply:

a logical value "0" occurs when the following applies to the complementary memory cells A1 and A2: A1=0 and A2=1.

A logical value "1" occurs when the following applies to the complementary memory cells A1 and A2: A1=1 and A2=0.

In the error-free case, the two memory cells A1 and A2 therefore always have complementary values: if the memory cell A1 has the value 0, the memory cell A2 has the value 1 and vice versa.

Complementary memory cells can be used for arbitrary k-from-n codes. The exemplary embodiment explained here describes an exemplary implementation based on a 3-from-6 code. A code word of the 3-from-6 code has 6 bits (states), of which 3 always have either the value 0 or the value 1, and the remaining 3 memory cells then have the complementary value thereto.

For example, 6 physical memory cells can be provided, which can be used, for example, to encode 4 bits by means of a complementary approach.

FIG. 2 shows a table illustrating how on the basis of 6 memory cells $Cell_0$ to $Cell_5$, 20 different states are represented. Each of the memory cells can have a high-resistance state (HRS) or a low-resistance state (LRS). Each of the states corresponds to a value assignment of these 6 memory cells $Cell_0$ to $Cell_5$ and also to a code word of the 3-from-6 code.

It is generally true for a k-from-n code that there are $$\binom{n}{k}$$

code words, each of which has k first values and (n-k) second values. The following applies:

$$\binom{n}{k} = \frac{n!}{k! \cdot (n-k)!}$$

and thus for the 3-from-6 code $$\binom{6}{3} = \frac{6!}{3! \cdot (6-3)!} = \frac{6!}{3! \cdot 3!} = \frac{120}{6} = 20.$$

Therefore, in the 3-from-6 code there are a total of 20 code words in which three bits have a first value and the other three bits have a second value. These code words can be used to represent, for example, $2^4$=16 states (i.e., to encode 4 bits), with 4 of the 20 code words remaining unused.

Figure 3A:
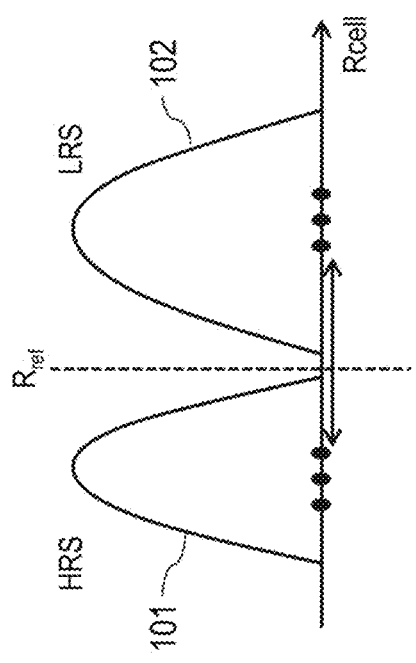
FIG. 3A is an exemplary diagram based on FIG. 1, wherein in contrast to FIG. 1 resistance values Rcell of a total of 6 memory cells are drawn, 3 memory cells having a low-resistance state (LRS) and 3 memory cells having a high-resistance state (HRS)

FIG. 3A shows an exemplary diagram based on FIG. 1, wherein in contrast to FIG. 1 resistance values Rcell of a total of 6 memory cells are drawn, 3 memory cells having a low-resistance state (LRS) and 3 memory cells having a high-resistance state (HRS). As in FIG. 1, the abscissa shows the resistance value Rcell of the respective cell.

Figure 3B:
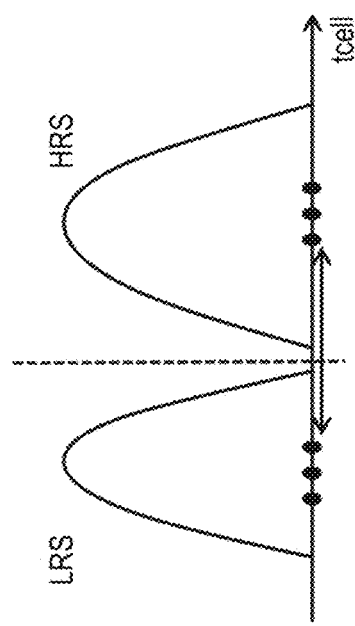
FIG. 3B is an exemplary diagram based on FIG. 3A after a transformation into the time domain.

FIG. 3B shows an exemplary diagram based on FIG. 3A, wherein in contrast to FIG. 3A, after a transformation into the time domain the abscissa represents a time tcell. The individual states of the memory cells can therefore be determined as a function of time.

For example, the 0-state (e.g., the LRS) can be measured faster than the 1-state (e.g. the HRS): thus, if in accordance with the above example of the 3-from-6 code the 0-state has been determined three times, then (in the case of an error-free measurement) upon the determination of the third 0-state it is already known that the remaining three states not yet determined must be 1-states. Thus, the code word can be determined early, as soon as only the three faster 0-states have been determined. It is not necessary to wait for the arrival of the slower 1-states.

It should be noted that in this example it is assumed that on average, the 0-states can be determined before the 1-states. In principle, it is sufficient if a first state can be determined faster than a second state.

An exemplary embodiment of the determination of three fastest 0-states is described, for example, in U.S. Pat. No. 9,805,771 B2. It is also described in more detail there how, based on a hold signal determined by a logic, a plurality of latches (for example, a latch can be implemented as a D-type flip-flop, see e.g. https://wikipedia.org/wiki/Latch) can be paused, or the state of these latches can be frozen. This mechanism of freezing the latches can also be realized for the purposes of the present implementation.

Figure 4:
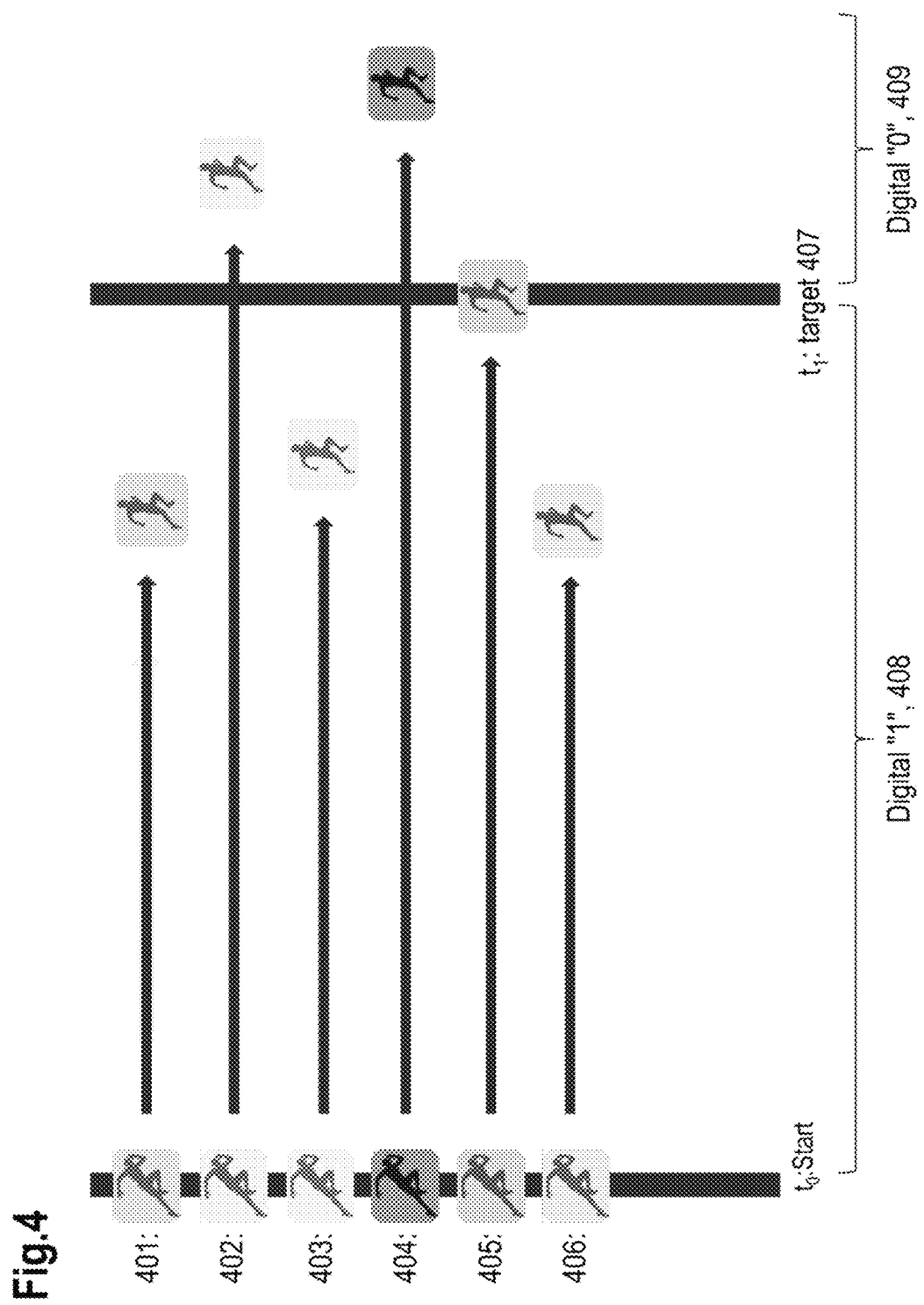
FIG. 4 is a diagram showing an example of the temporal measurement of the states "0" and "1" from memory cells.

FIG. 4 shows a diagram showing an example of the temporal measurement of the states "0" and "1". Each of the memory cells 401 to 406 represents one of these two states. In the example shown in FIG. 4 the following exemplary assignment of the memory cells applies:

Memory cell 401: State "1",
Memory cell 402: State "0",
Memory cell 403: State "1",
Memory cell 404: State "0",
Memory cell 405: State "0",
Memory cell 406: State "1".

As has already been stated, the 0-state corresponds, for example, to a low resistance value (LRS) in accordance with the distribution 102 and the 1-state then corresponds to a high resistance value (HRS) in accordance with the distribution 101. As a result of the transformation into the time domain it is found that the LRS "0" can be determined earlier than the HRS "1".

A memory cell in the 0-state (with the value of 0) has a lower resistance value than a memory cell in the 1-state (with a value of 1), therefore a higher current flows through the memory cell with the value 0. If this current is integrated over time by means of a capacitor, the result is a voltage. This voltage increases more steeply with time and reaches a pre-defined threshold much earlier than if the memory cell had the value 1 and thus had a high resistance (and therefore a lower current would flow). It follows that memory cells with the value of 0 can be determined earlier than memory cells with the value of 1.

The representation selected in FIG. 4 uses in this sense the analogy of a race, wherein the memory cell with the lowest resistance (and therefore the largest gradient of the integrated current over time) reaches a target 407 the fastest.

Accordingly, the measurement begins at time $t=t_0$ ("Start"), and at time $t=t_1$ ("Target"), the first three 0-states for the memory cells 404, 402 and 405 can already be determined. The other memory cells 401, 403 and 406 have not yet reached the target, i.e. the voltage threshold value by means of the described integration.

From the measurement the chronological order in which the memory cells have reached the target (i.e., the threshold value in the integration of the current) is known; in this case these are: first the memory cell 404, then the memory cell 402 and lastly, the memory cell 405.

In the present example of the 3-from-6 code, exactly 3 of the 6 memory cells have the 0-state and the remaining three memory cells have the 1-state. Since the 0-state can be detected earlier than the 1-state, the measurement can be terminated as soon as the third (and therefore last) 0-state has been determined. This is subject to the condition that the 0-states actually can be determined earlier than the 1-states.

Therefore, the target 407 divides the possible states of the memory cells 401 to 406 into two regions, a region 408 for the 1-states and a region 409 for the 0-states. It would thus take considerably more time until the memory cells with the 1-state reach the specified voltage threshold value. These memory cells (in the example of FIG. 4 the memory cells 401, 403 and 406) have thus not yet reached the target 407 at time $t_1$, at which three 0-states were already able to be determined. At this point in time $t_1$, the third 0-state could be determined. This is also the time when the measurement can be terminated and when the states at the measuring amplifiers, which are connected to the memory cells, can be frozen. In this example, after the freezing there are three 0-states present for the memory cells 404, 402 and 405. The remaining three states for the memory cells 401, 403 and 406 are each set to 1.

In summary, the code word can thus be determined as soon as the first three "0" states occur. In the example shown in FIG. 4, the code word 101001 (LSB corresponds to the memory cell 406) can be determined at time $t_1$.

Figure 5:
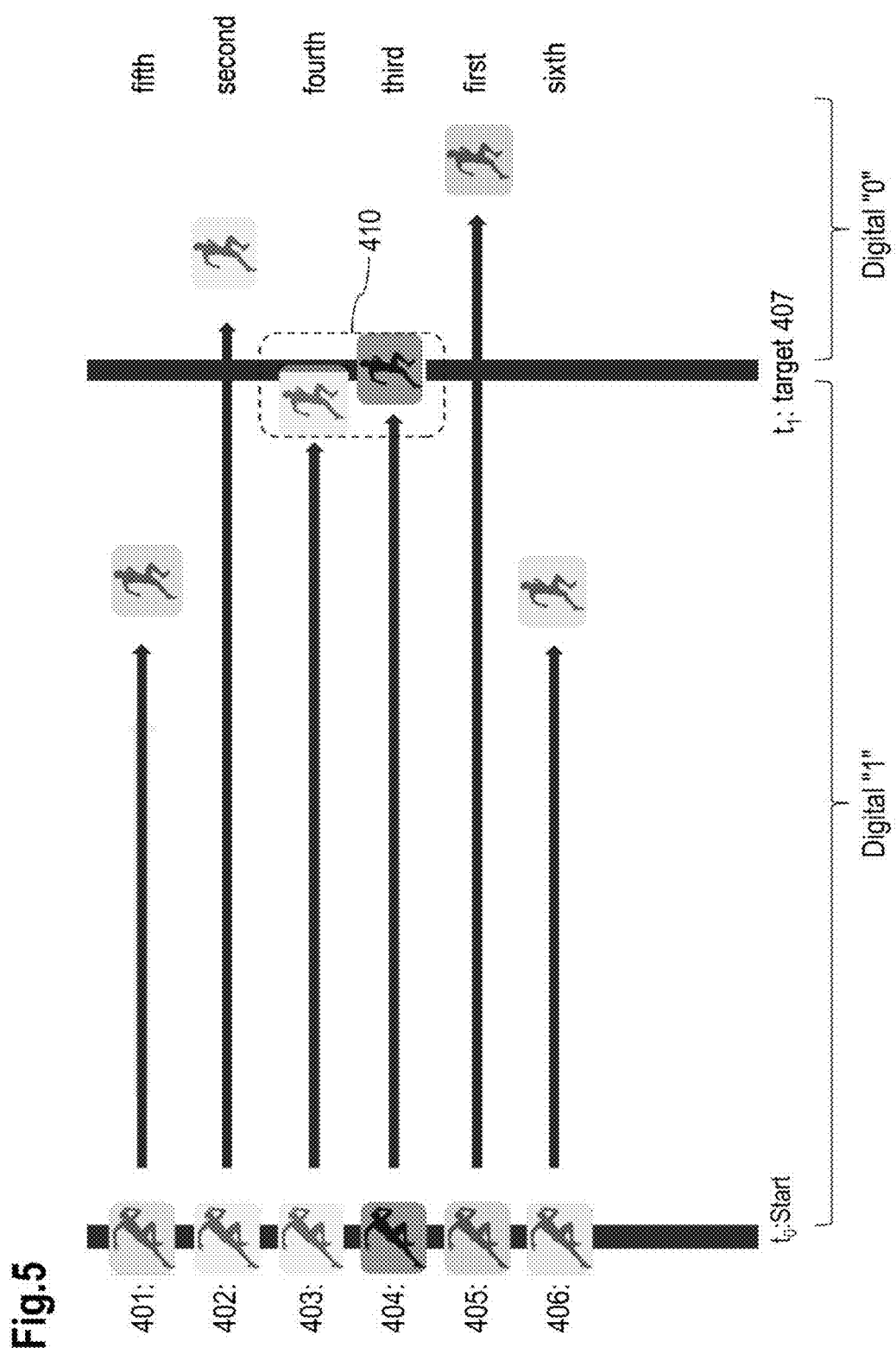
FIG. 5 is based on FIG. 4, a case in which the states of two memory cells occur within a reading window during the temporal measurement.

FIG. 5 shows, based on FIG. 4, a case in which the 0-state is determined for the two memory cells 403 and 404 within a reading window 410, although the memory cells 402 and 405 had previously reached the 0-state. The memory cells 403 and 404 therefore reach the 0-state together in the (temporal) reading window 410, although in fact the memory cell 403 provides the fastest 1-state and the memory cell 404 the slowest 0-state.

Therefore the 0-state is present four times. However, this is not a code word of the 3-from-6 code. This configuration deviating from the expected value (3 zeros and 3 ones) can also be used as a group error signal for downstream error detection procedures.

The sequence of the arrival of the fastest states can only be determined if a certain minimum time interval exists between successively incoming states. In FIG. 5 the reading window 410 is smaller than the required minimum interval.

Thus, an error initially occurs that can easily be detected, because 6 bits with four 0-states cannot represent a code word of the 3-from-6 code.

As a result of the measurement in the time domain described here, it follows that the states of the memory cells occur in a certain chronological sequence. This applies in particular to the 0-states, which in the error-free case occur faster (earlier) than the 1-states. The chronological sequence of the arrival of the 0-states can be used to determine which memory cells have caused the error.

For example, by means of a logic (circuit) which detects the two fastest 0-states, it is possible to determine the two 0-states of the memory cells 402 and 405. It follows that the memory cells 403 and 404, which have the remaining two 0-states, must have arrived together within the reading window 410.

In principle, it is possible that the sequence of the incoming 0-states can be determined by a logic being provided in each case, which detects the fastest (k−1) states (where k>1). It is then possible that the two fastest, etc. up to the k fastest 0-states, can be determined and thus it is known which two 0-states have arrived in a reading window together, or inadmissibly.

In the example of the 3-from-6 code, the 2 fastest 0-states and the 3 fastest 0-states can be determined, for example. This may be carried out, for example, in parallel with two logic circuits.

In the example of the 4-from-8 code, the 2 fastest 0-states, the 3 fastest 0-states and the 4 fastest 0-states can be determined, for example. This may be carried out, for example, in parallel with three logic circuits.

In the example described here it can therefore be determined that the memory cells 403 and 404 were the last to arrive together in the reading window 410, and the error is the fact that the 0-state has been incorrectly assigned to one of the two memory cells. Thus, the states of the memory cells 403 and 404 determined within the reading window 410 can now be modified and checked by means of a downstream error processing stage.

According to the illustration shown in FIG. 5, the following possibilities exist (sequence of the states in accordance with the memory cells 401 to 406), wherein it is assumed by way of example that 101001 (LSB is provided by the memory cell 406) is the actual correct code word:

101001: correct assignment of the states;

100001: this is obviously an error, since this is not a code word of a 3-from-6 code (there are 4 zeros instead of 3);

100101: incorrect assignment of the states; this is also a code word of the 3-from-6 code.

Since the memory cells 403 and 404 arrive within the reading window 410, initially both the code word 101001 and the code word 100101 could be correct.

By means of the downstream error processing, which can be implemented, for example, as a circuit or as a functional block of a circuit or as software, it is determined which of the code words is the correct code word.

For example, for this purpose one of the two code words (or both code words) can be fed to the error processing; if the error processing returns an error, then this is the wrong code word, otherwise it is the correct code word. One of the two code words can be efficiently fed to the error processing. If no error occurs, it was the correct code word and is further processed accordingly. If the error processing indicates an error, the other of the two code words is used as the correct code word for further processing.

The error processing can comprise an error detection and/or error correction.

There is also an option to form the two code words 101001 and 100101 from the incorrect word 100001 in parallel (i.e., at least partially simultaneously), and by using the downstream error processing to verify the code word 101001 as the correct code word.

Another option, after the erroneous word 100001 has been determined, is to invert the individual bit positions that have the value 0 into the value 1 one after the other, and so to form the code words 110001, 101001, 100101 and 100011. On the basis of the error processing the code word 101001 can then be verified as the correct code word. The processing can be carried out sequentially and/or in parallel.

To determine the valid code word, an error handling can be carried out, for example using error detection. The error handling can be carried out in hardware, software or partially in hardware and partially in software. The error handling for the determination of a valid code word can be carried out, for example, using an error code, wherein the error code can be an error-detecting code or an error-detecting and error-correcting code.

For example, the error code can comprise test bits, which are formed from bits of different groups of n bits.

For example, there is an option to form test bits using a Berger code, the data bits of the Berger code each being the n bits of the various bit groups. This can exploit the fact that errorful bit groups have more zeros than the error-free bit groups, and therefore all such errors are detected by the Berger code.

There is an option to perform the error handling on the bits or the bit groups of 4 bits, which are transformed into the code words of the 3-from-6 code or into which the code words of the 3-from-6 code are transformed back after they have been read out from the memory using a chronological order, for example.

FIG. 11 shows a schematic flow diagram, which shows exemplary acts for carrying out a compensation of a read error as described here.

At 1101, when reading six memory cells the three fastest 0-states are detected. As soon as they are available, at 1102 the states read at this point in time are frozen. The frozen states indicate at least three 0-states (1-states are now already assigned, for example, to the remaining memory cells).

At 1103 it is tested to determine whether more than three 0-states exist, which would correspond to a read error. If this is not the case, at 1104 the code word that was read is processed further. If it has not already occurred, 1-states can now also be assigned to the other three memory cells.

If a read error is present, at 1105 it is determined which positions in the group of six bits are affected by the read error, i.e. which two states arrived in a reading window together. In the example according to FIG. 5, this corresponds to the two memory cells 403 and 404, which jointly occur in the reading window 410. By detection of the two fastest 0-states, it is possible to detect the first two 0-states of the memory cells 405 and 402, so that the two memory cells 403 and 404 are now eligible as a possible cause of the read error. In addition, therefore, at 1105 the first of the two states is set to 1 (the second state remains at 0) and the resultant code word is fed to the error processing stage.

At 1106 a check is performed to determine whether the error processing accepts the code word. If this is the case, at 1107 this code word is processed further.

If the error processing at 1106 indicates an error, however, at 1108 the second of the two states is set to 1 (the first state is then 0) and further processing is continued with this code word. Optionally, this code word could be checked once again by means of the error processing.

In particular, to provide verification using error correction, a separate time slot can be provided. Another option is that the testing at 1105 is carried out at least partly synchronously, in order to reduce the processing time.

In one embodiment, the error processing thus assesses whether an error is present for a group of bits. In the example shown here, the group of bits comprises a total of 6 bits. In general, the group of bits can also be referred to as a byte, the byte comprising at least two bits.

This makes it possible to verify the correct code word for the group of bits, by means of the error processing. For example, if code words are used, each of which comprises n bits, then the error processing can determine for each group of n bits whether or not an error is present.

Thus, it is possible that a detection (sensing) of bits performed in the time domain can be carried out efficiently, even if part of the bits of the group of bits falls within the reading window 410 together.

Alternatively, it is also possible at 1105 to set the most recently received states to both 01 and to 10 and to leave the rest of the states unchanged and to feed the thus determined code words of the 3-from-6 code to the error processing stage and to process the code word of the 3-from-6 code further, for which no error is indicated.

Figure 6:
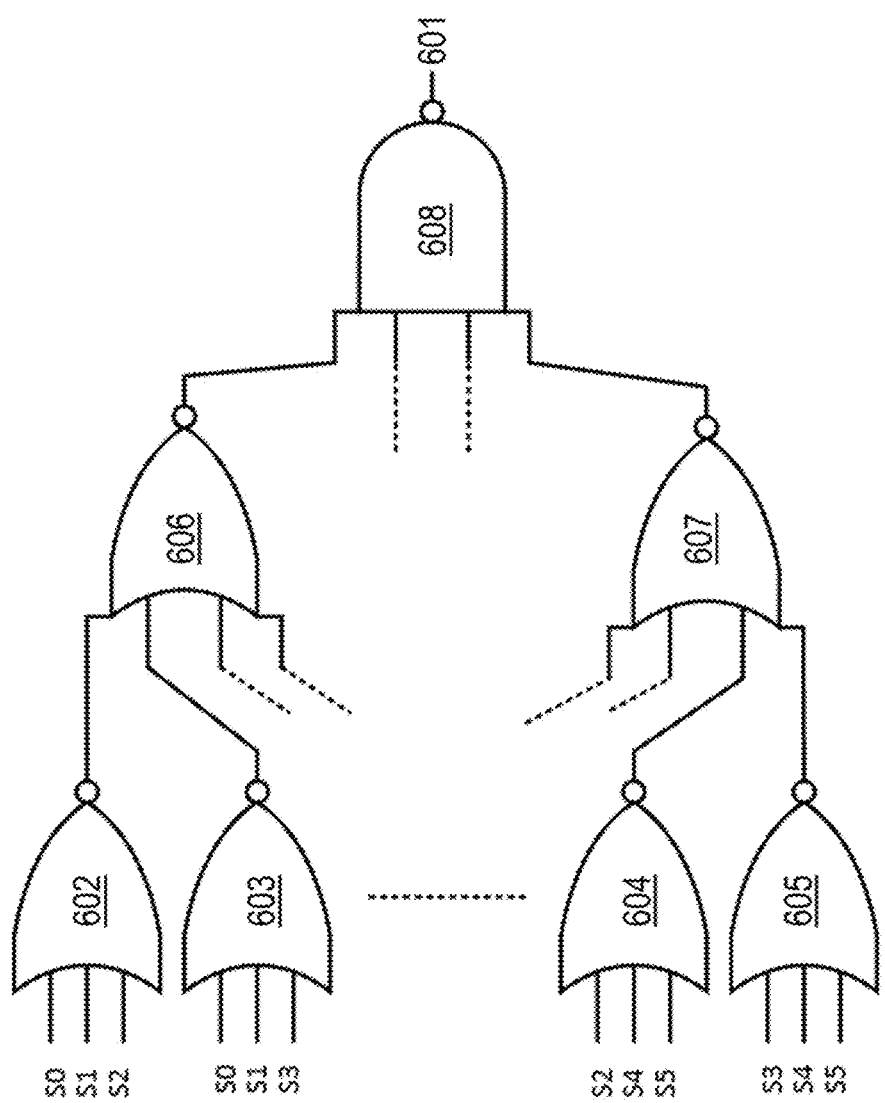
FIG. 6 is an example logic circuit for determining the three fastest 0-states.

FIG. 6 shows an exemplary logic circuit for determining the three fastest 0-states using an output signal 601, which is based on the six states S0 to S5. In this case, each state is provided as a signal for a memory cell of a measurement amplifier (sense amplifier). Therefore, the states S0 to S5 correspond to signals (0 or 1) of the 6 memory cells.

The states S0 to S5 are provided in the form of binary values.

In the case of the 3-from-6 code, after the arrival of the third 0-state it can be concluded that the remaining states must be 1. Following this example, the circuit according to FIG. 6 shows a logic for the detection of the three fastest bits, which—as stated above—are 0-states (i.e. have the value 0). Thus, if the output signal 601 has the value 1, this indicates that the value 0 was detected three times at the outputs of the measurement amplifiers.

To this end, the circuit according to FIG. 6 uses NOR gates by way of example. At the input a plurality of NOR gates are provided, each of which has three inputs and one output. For each code word three of the 6 states S0 to S5 always have the value 0, thus the possible code words generate 20 combinations in which exactly three of the states S0 to S5 are equal to 0. These combinations correspond to the assignments of the inputs of the total of 20 NOR gates 602 to 605 (for the sake of clarity, not all 20 NOR gates are drawn, but only a selection of four NOR gates).

FIG. 7 shows an example of a corresponding truth table. The lines 1 to 20 represent possible code words of the 3-from-6 code. There are 20 possibilities for the states S0 to S5 to assume the value "0" three times and the value "1" three times. For example, the lines 1 to 16 (i.e., 16 possible code words of the 3-from-6 code) can be used to represent 16 possible states, which are coded with four bits ($2^4=16$). The then remaining 4 code words of the lines 17 to 20 are then unused, as they are code words of the 3-from-6 code, but ones which are not valid or not used for the encoding of the 16 states. Alternatively, it is also possible to use a different 16 code words from the 20 possible code words than the first 16 code words shown in the table. These "unused" code words can be used for other purposes. For example, they can be used to invalidate certain data (i.e. mark them as invalid).

For each assignment with 0-states of the 20 lines shown in FIG. 7, one of the above-mentioned NOR gates 602 to 605 can be used. Hence one NOR gate each is connected to each of the 0-states of a row.

Thus, for example, the inputs of the NOR gate 602 are connected to the states S0, S1 and S2. This corresponds to row 1 of the table shown in FIG. 7, according to which the states S0, S1 and S2 have the value 0. Correspondingly, the inputs of the NOR gate 603 are connected to the states S0, S1 and S3. This corresponds to row 2 of the table shown in FIG. 7, according to which the states S0, S1 and S3 have the value 0.

Accordingly, the other NOR gates are connected to the signals of the states S0 to S5.

Finally, the inputs of the NOR gate 604 are connected to the states S2, S4 and S5. This corresponds to row 19 of the table shown in FIG. 7, according to which the states S2, S4 and S5 have the value 0. The inputs of the NOR gate 605 are connected to the states S3, S4 and S5. This corresponds to row 20 of the table shown in FIG. 7, according to which the states S3, S4 and S5 have the value 0.

Thus, each of these NOR gates 602 to 605 delivers at its output the value 1 only when all of its inputs have the value 0.

The following example implementation comprising five NOR gates 606 to 607 (each with four inputs) and one NAND gate 608 (with five inputs) corresponds to an OR logical combination of the outputs of all NOR gates 602 to 605 to form the output signal 601.

So, for example, in FIG. 6 each output of one of the NOR gates 602 to 605 is connected to an input of one of the following NOR gates 606 to 607. The outputs of the NOR gates 606 to 607 are connected to the inputs of the NAND gate 608.

The output signal 601 has the value 1 only if three fastest bits have been detected. If three fastest bits were not detected, the output signals of the NOR gates 602 to 605 are all 0, the outputs of the NOR gates 606 to 607 are all 1 and the output signal 601 has the value 0. However, as soon as the value 0 is applied at three of the six possible states S0 to S5, the NOR gate 602 to 605, which reflects this combination at its inputs, switches from 0 to 1 at its output, so that the outputs of the NOR gates 606 to 607 also switch from 1 to 0 and the output signal 601 toggles from 0 to 1.

In general, the detection of the m fastest 0-states can be detected with a circuit which in a first level has a number of NOR gates which corresponds to the m-from-n possible combinations. Each of the NOR gates has m inputs and each of the NOR gates reflects at its inputs one of the m-from-n possible combinations in which m 0-states can occur. The outputs of the NOR gates are then logically OR-ed to form an output signal. For example, this logical OR combination can be implemented by a two-stage use of NOR gates and a NAND gate, as shown in FIG. 6. The output signal indicates with a value of 1 that at least m 0-states exist. Otherwise, the output signal has the value 0.

A plurality of such logic circuits can be used to determine different numbers $m_1$, $m_2$, etc. of 0-states. Whenever the output signal of the respective logic circuit has the value 1, the 0-states are registered. Thus, it is possible to determine which 0-states occur and in what order.

Figure 8:
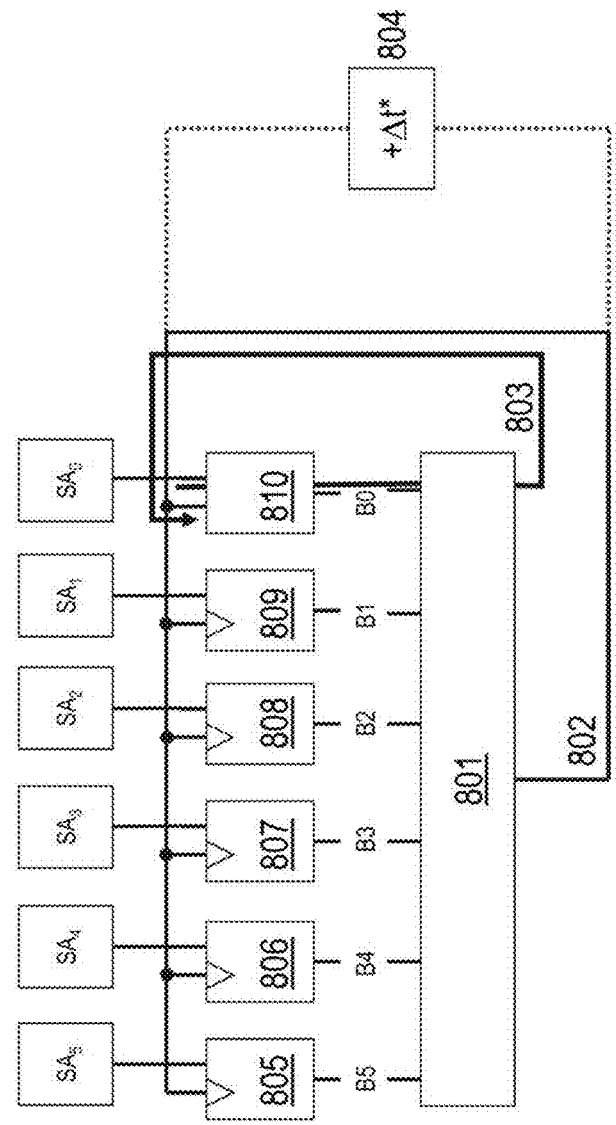
FIG. 8 is an example circuit arrangement for the implementation of the logic circuit shown in FIG. 6.

FIG. 8 shows an example circuit arrangement, wherein the logic circuit shown in FIG. 6 can be accommodated in a block 801. For example, in the block 801 each logic circuit which enables a detection of the m fastest 0-states can be accommodated. FIG. 8 describes how, using such a logic circuit, these m fastest 0-states at the time of their occurrence can be frozen and therefore registered.

Measurement amplifiers $SA_0$ to $SA_5$ provide the states S0 to S5 of the memory cells. These states are supplied via latches 805 to 810 (e.g. D flip-flops) to the block 801. In the block 801, the three fastest 0-states are detected and via a connection 802 the states of the latches 805 to 810 are frozen ("latched").

Thus, as soon as the output signal 601 of the logic circuit shown in FIG. 6 switches from 0 to 1, the fastest three 0-states are detected and the latches 805 to 810 are held in such a way that the output signals they provide no longer change. At this "frozen" time, therefore, the three fastest 0-states are present at the outputs of the latches 805 to 810. At the outputs of the latches 805 to 810, the states can be captured in the form of bits B0 to B5 and further processed and/or stored.

Between the time at which the output signal 601 switches from 0 to 1 until the time at which the outputs of the latches 805 to 810 are frozen, a time $\Delta t$ elapses. During this time $\Delta t$, (see comments on FIG. 5), for example, two memory cells can fall into the reading window 410 and the 0-state can be assigned for both of these memory cells.

As an option, in particular to adjust the time window, an additional delay $\Delta t^*$ can be provided so that other states may also possibly be included in the time window. This is particularly useful for the detection of critical states that may not (yet) be visible under normal conditions, but due to a small additional unfavorable shift of cell states in the group may lead to an incorrect detection.

A possible countermeasure may take the form of a reprogramming of the memory (e.g. the RRAM), or an appropriate redundant design for the faulty memory cell(s) can be provided already when testing the memory. This is particularly important for safety applications, for example, identifying and resolving critical situations.

Optional: Error Detection

Figure 9:
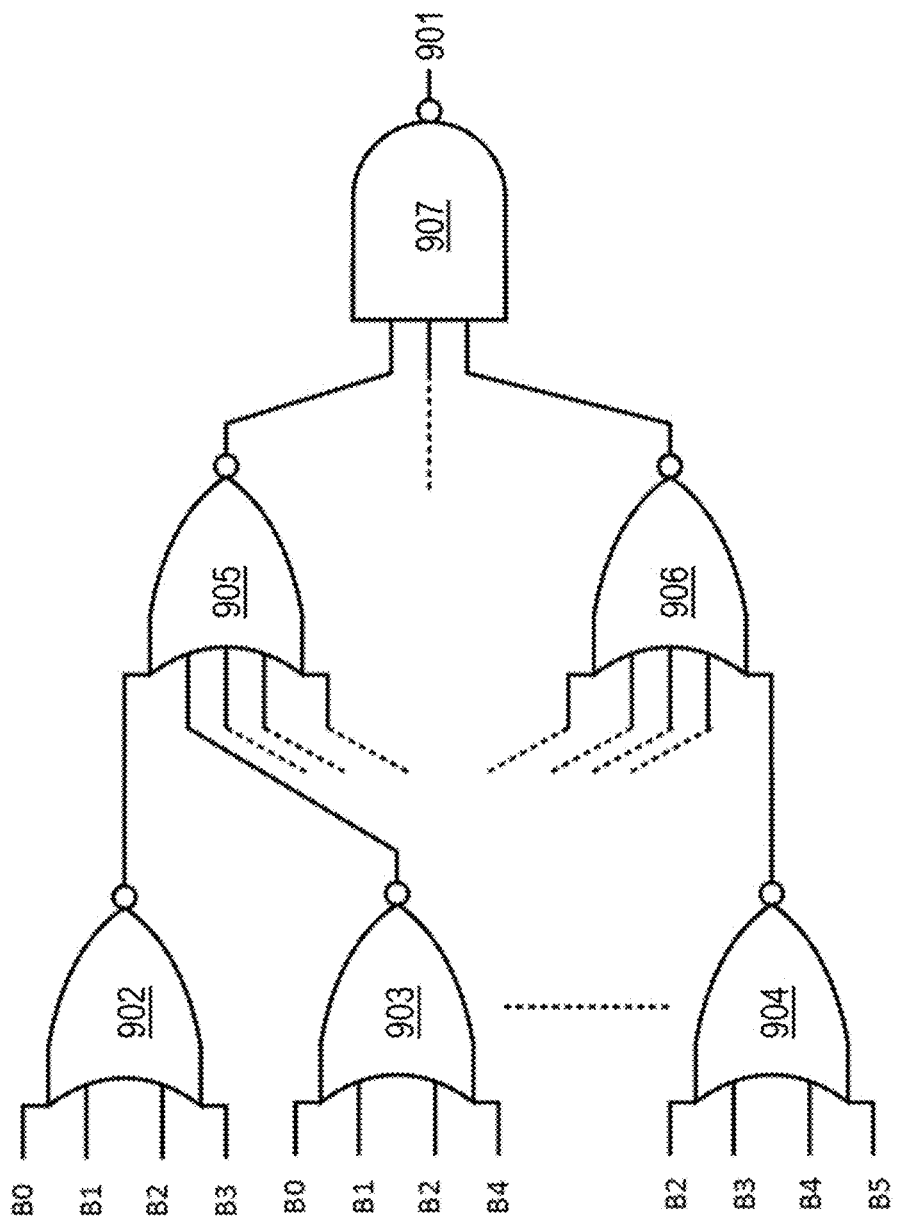
FIG. 9 is an example circuit for the detection of four 0-states.

FIG. 9 shows an example circuit for the detection of more than three 0-states in a group of six bits, here bits B0 to B5. Such a group of bits, which has four 0-states, is not a valid code word of the 3-from-6 code.

The structure of the circuit is similar to the circuit shown in FIG. 6. All possible 4-bit combinations of the six bits B0 to B5 are each applied to a NOR gate with four inputs and the outputs of the NOR gates are then functionally OR-ed to form an output signal, which outputs the value 1 if and only if the value 0 is present four times at the inputs of one of the NOR gates, in other words if four 0-states occur in any 4-bit-combination of the six bits B0 to B5.

Thus, FIG. 9 has an input stage with (4-from-6=) 15 NOR gates 902 to 904, each of the NOR gates 902 to 904 having four inputs and one output.

At each of the inputs to the NOR gates 902 to 904, four different bits from B0 to B5 are connected. There are a total of 15 possible combinations in which to apply the 6 bits B0 to B5 to the four inputs of the NOR gates 902 to 904. Each of these combinations is assigned its own NOR gate 902 to 904.

As described above with reference to FIG. 6, the value 1 is present at the output of one of the NOR gates 902 to 904 if and only if all inputs are 0. Thus, if four zeros incorrectly occur in the six bits B0 to B5, then this is detected by the at least one affected NOR gate 902 to 904, and its output changes from 0 to 1. The outputs of the NOR gates 902 to 904 are logically OR-ed, so that an output signal 901 of the circuit shown in FIG. 9 changes to 1 if four or more zeros have occurred in the six bits B0 to B5.

As was already stated in relation to FIG. 6, three NOR gates 905 to 906 (for the sake of clarity just two are shown) and one NAND gate 907 represent an example implementation of an OR operation. In this example, each of the NOR gates 905 to 906 has five inputs and one output, one input each being connected to one of the outputs of the 15 NOR gates 902 to 904. The NAND gate 907 has three inputs and one output, one input being connected to one output of the NOR gates 905 to 906. At the output of the NAND gate 907, the output signal 901 is provided.

The realization of the logical OR logic operation otherwise also follows by simple Boolean rearrangement under application of De Morgan's laws and the double negation law (see, for example, https://de.wikipedia.org/wiki/Boolesche_Algebra).

Error Detection for Group of Bits

In the previous example, the group comprises a number of six bits, i.e. every bit of the group is based on a current of a memory cell which is detected by means of a measurement amplifier. The previously described transformation into the time domain allows a temporal sequence of the arrival of the states, in particular the fast 0-states, to be determined. This means it is possible to determine whether, for example, the fastest two 0-states, the fastest three 0-states, etc. have arrived. In the case of the 3-from-6 code, for example, it is determined whether the fastest three 0-states have arrived. If this is the case, the measurement is paused (e.g. by means of the described latches), so that the values at the outputs of the measurement amplifiers can be captured. If it now turns out that not three, but four 0-states were detected, this is obviously an error; for example, in that case the fastest 1-state must have arrived in a reading window together with the slowest 0-state. A parallel measurement of the two fastest 0-states makes it possible to distinguish these from the two states that were determined in the reading window together. This makes it possible to selectively manipulate the two states determined in the reading window, and by means of an error processing stage to determine which state combination for the last two arriving states is correct.

Advantageously therefore, the error processing is also carried out based on the group of bits so that (in accordance with the present example) for each six bits a processing by means of the measuring amplifiers and a subsequent verification and control by means of the error processing can always be carried out.

Furthermore, it is therefore advantageous that a plurality of bits are divided into a number of such groups of e.g. 6 bits and for each individual group of 6 bits the mechanism described above, including optional error processing, is performed to correct possibly erroneously assigned 0-states.

It should be noted here that in this example the number of bits in the group is 6 bits. Accordingly, the group of bits can have any other number of multiple bits. If each group of bits has a number of n bits, these n bits are then code words. Optionally, they can be code words of a k-from-n code.

Exemplary System Implementation: MRAM

FIG. 10 shows an exemplary system implementation for an MRAM 1010 comprising a plurality of memory cells. Using measurement amplifier circuit 1011 the values stored in the memory cells are read out and by means of the error logic (e.g., circuitry) 1012 described here, the memory cells are mapped to logical (0- or 1-) states. This error logic 1012 comprises, for example, the determination of the k fastest states of a k-from-n code, as explained above. As soon as the k fastest states are present, the outputs of the memory cells (the outputs of the measuring amplifiers, assigned to the memory cells, which indicate the states of the memory cells) are frozen. This takes place, for example, by means of the circuit described in FIG. 8, according to which via the connection 802 the latches 805 to 810 are "latched" (paused or frozen) so that the k fastest states (in the example described, these are the 0-states) are present at the outputs of the latches 805 to 810. After a corresponding signal, which is transmitted via the connection 802, these states can no longer change and are frozen until enabled again (e.g. also via the connection 802).

If the states do not represent a valid code word, a test is performed to determine which code word is accepted by an error processing circuitry 1013. This is then the correct code word of the k-from-n code and is used for further processing.

The error processing circuitry 1013 can use an error code, for example. The error code can be an error-detecting code which has test bits that are formed from the bits of different groups of n bits. The test bits can be formed, for example, by means of a Berger code or by means of a BCH code.

The error processing circuitry 1013 can comprise, as explained, an error detection and/or error correction. The error processing circuitry 1013 is coupled to a system bus 1014.

The measuring amplifier can access the memory in groups of n bits. Thus, a bit string which is read from each of n memory cells can be further processed as a group of n bits. In error-free operation, each of the bit strings represents a code word of a k-from-n code. For example, n can be equal to 6 or equal to 8.

Further Embodiments and Advantages

As mentioned above, the circuit shown in FIG. 8 can also be used, for example, to determine two instead of three of the fastest states. FIG. 8 shows how the three fastest states (here using the example of 0-states) are determined.

Accordingly, the block 801 can be replaced by a circuit which determines two fastest states, for example. In this case, a logic circuit similar to FIG. 9 would need to be provided, with a total of 15 NOR gates each with two inputs being provided (there are 15 possible combinations of two states in six possible bits), the outputs of which are then logically OR-ed together to form an output signal (e.g., in accordance with the circuit diagram of FIG. 6 or FIG. 9 using further NOR gates and an aggregating NAND gate). The output signal changes from 0 to 1, as soon as both inputs have the value 0 on one of the NOR gates of the first level, i.e. a 0-state is detected at two different bits.

Such a circuit can be used, for example, as part of the error processing circuitry to determine which are the two fastest 0-states. Thus, it is possible to efficiently exclude at least the first two (fastest) 0-states (in FIG. 5, this corresponds to the memory cells 402 and 405). It then only remains to distinguish between the two memory cells 403 and 404, from which the correct 0-state is output. Therefore, by means of a plurality of such logic circuits which can be operated, for example, in parallel or at least partially in parallel (i.e. partially or entirely at the same time), the sequence of the determination of the states can be determined. Having knowledge of the sequence it can then be determined which states arrived together in a reading window.

The approach described here thus enables an efficient error compensation in determining the states of memory cells in the time domain, wherein the memory cells, for example, comprise complementary memory cells and wherein the states of at least two memory cells are determined in a brief reading window. If these two memory cells are such memory cells, which—provided both are assigned the same state—do not result in any further code word of a given k-from-n code, a read error is present and by integrating a normally present error circuit (which comprises an error detection and/or error correction), the error compensation described here can efficiently determine by means of trials which code word is the correct one. By knowledge of the two memory cells which have arrived in the reading window together, a specific combination of states (for example, 01 or 10) can be adopted for these memory cells, and thus the read error can be compensated quickly and efficiently.

For example, the approach described here is applicable to memory technologies which, on account of their small reading windows, caused in particular by degradation and/or temperature effects, are susceptible to read errors. This is particularly true for mutually complementary memory cells and/or reading methods, which use complex and precise reference currents.

The error circuit mentioned here can comprise or use known error detection and/or error correction methods.

Using the solution described here, the reliability of the memory used, in particular when reading data from the memory, is advantageously increased and possible temperature or degradation effects are at least partially compensated.

Although the disclosure has been illustrated and described in detail by means of the at least one exemplary embodiment shown, the disclosure is not restricted thereto and other variations can be derived therefrom by the person skilled in the art without departing from the scope of protection of the disclosure.

What is claimed is:

1. A method for compensating for a read error in a k-from-n code in which k bits of n bits in a valid code word have a same value and remaining n-k bits have a different value, comprising:
    reading each of n states from n memory cells of a memory, respectively, during a reading window in a time domain, and
    when the n states do not form a code word of the k-from-n code,
        setting states of m of the n memory cells that have fastest states to respective states read during the reading window;
        setting states of n-m-x of the n memory cells that have slowest states to a different state than the states of the m of the n memory cells;
        setting states of x remaining memory cells to states corresponding to a first valid assignment;
        feeding the n states to an error processing stage,
        when the error processing stage does not indicate an error, processing the n states, and
        when the error processing stage indicates an error, setting states of the x remaining memory cells to states corresponding to a second valid assignment and processing the n states with the second valid assignment.

2. The method of claim 1, wherein the first valid assignment is a first code word and the second valid assignment is a second code word.

3. The method of claim 1, wherein the memory cells are read in groups of n memory cells.

4. The method of claim 1, wherein the memory cells are complementary memory cells of a complementary memory.

5. The method of claim 1, wherein the fastest states correspond to states that have reached a first threshold value prior to the reading window and the slowest states correspond to states that have not reached a second threshold value during the reading window.

6. The method of claim 1, determining that the n states are not a code word of the k-from-n code when at least one other fastest state is determined for a k-th fastest state during the reading window.

7. The method of claim 1, wherein:
    for k=3 a k fastest and a k−1 fastest states are determined in parallel,
    for k=4 a k fastest, a k−1 fastest and a k−2 fastest states are determined in parallel, or
    for k=5 a k fastest, a k−1 fastest, a k−2 fastest and a k−3 fastest states are determined in parallel.

8. The method of claim 1, wherein the error processing comprises an error detection and/or error correction.

9. The method of claim 1, further comprising a processing circuit functionally coupled between the memory and an error processing circuit, which is coupled to a system bus.

10. The method of claim 1, wherein the memory comprises at least one of:
    floating-gate-cells;
    PCRAM,
    RRAM,
    MRAM,
    MONOS components,
    nanocrystal cells, and
    ROM.

11. A device for compensating for a read error in a k-from-n code in which k bits of n bits in a valid code word have a same value and remaining n-k bits have a different value, comprising:
    a memory;
    a processing circuit operably coupled to the memory; and
    an error processing circuit coupled to the processing circuit,
    wherein the processing circuit is configured to:
        read each of n states from n memory cells of the memory, respectively, during a reading window in a time domain,
        when the n states do not form a code word of the k-from-n code,
            set states of m of the n memory cells that have fastest states to respective states read during the reading window;
            set states of n-m-x of the n memory cells that have slowest states to a different state than the states of the m of the n memory cells;
            set states of x remaining memory cells to states corresponding to a first valid assignment;
            feed the n states to the error processing circuit,
            when the error processing circuit does not indicate an error, process the n states, and
            when the error processing circuit indicates an error, set states of the x remaining memory cells to states corresponding to a second valid assignment and process the n states with the second valid assignment.

12. A device for compensating for a read error in a k-from-n code in which k bits of n bits in a valid code word have a same value and remaining n-k bits have a different value, comprising:
    means for reading each of n states from n memory cells of a memory, the n states being read during a reading window in a time domain,
    means for setting states of m of the n memory cells that have fastest states to respective states read during the reading window, setting states of n-m-x of the n memory cells that have slowest states to a different state than the states of the m of the n memory cells, and setting states of x remaining memory cells to states corresponding to a first valid assignment when the n states do not form a code word of the k-from-n code;
    means for feeding the n states to an error processing stage when the n states do not form a code word of a k-from-n code, and
    means for
        further processing the n states when the error processing stage does not indicate an error,
        setting states of the x remaining memory cells to states corresponding to a second valid assignment when the error processing stage indicates an error, and
        further processing the n states corresponding to the second valid assignment.

13. A non-transitory computer-readable storage medium comprising instructions that when executed by a processor circuit cause the processor circuit to:
   read each of n states from n memory cells of a memory, respectively, during a reading window in a time domain,
   when the n states do not form a code word of a k-from-n code in which k bits of n bits in a valid code word have a same value and remaining n-k bits have a different value,
      setting states of m of the n memory cells that have fastest states to respective states read during the reading window;
      setting states of n-m-x of the n memory cells that have slowest states to a different state than the states of the m of the n memory cells;
      setting states of x remaining memory cells to states corresponding to a first valid assignment;
   feed the n states to an error processing circuit,
   when the error processing circuit does not indicate an error, process the n states, and
   when the error processing circuit indicates an error, setting states of the x remaining memory cells to states corresponding to a second valid assignment and process the n states with the second valid assignment.

14. The method of claim 1, wherein k=3, n=6, x=2, and m=2.

15. The method of claim 1, wherein m=k−1.

16. The device of claim 11, wherein the fastest states correspond to states that have reached a first threshold value prior to the reading window and the slowest states correspond to states that have not reached a second threshold value during the reading window.

17. The device of claim 11, wherein:
   for k=3 a k fastest and a k−1 fastest states are determined in parallel,
   for k=4 a k fastest, a k−1 fastest and a k−2 fastest states are determined in parallel, or
   for k=5 a k fastest, a k−1 fastest, a k−2 fastest and a k−3 fastest states are determined in parallel.

18. The device of claim 11, wherein the memory comprises at least one of:
   floating-gate-cells;
   PCRAM,
   RRAM,
   MRAM,
   MONOS components,
   nanocrystal cells, and
   ROM.

19. The device of claim 11, wherein k=3, n=6, x=2, and m=2.

20. The device of claim 11, wherein m=k−1.

* * * * *